United States Patent
Shoor et al.

(10) Patent No.: US 9,568,530 B2
(45) Date of Patent: Feb. 14, 2017

(54) ACTIVE CABLE TESTING

(71) Applicant: INTEL CORPORATION, Santa Clara, CA (US)

(72) Inventors: Ehud Udi Shoor, Haifa (IL); Dror Lazar, Kiryat Bialik (IL); Adee O. Ran, Maayan Baruch (IL)

(73) Assignee: INTEL CORPORATION, Santa Clara, CA (US)

( * ) Notice: Subject to any disclaimer, the term of this patent is extended or adjusted under 35 U.S.C. 154(b) by 143 days.

(21) Appl. No.: 14/527,560

(22) Filed: Oct. 29, 2014

(65) Prior Publication Data
US 2016/0124034 A1 May 5, 2016

(51) Int. Cl.
| | |
|---|---|
| *G01R 31/02* | (2006.01) |
| *G01M 11/00* | (2006.01) |
| *H04B 3/46* | (2015.01) |
| *H04B 3/36* | (2006.01) |

(52) U.S. Cl.
CPC ............ *G01R 31/021* (2013.01); *G01M 11/33* (2013.01); *H04B 3/46* (2013.01); *H04B 3/36* (2013.01)

(58) Field of Classification Search
CPC .............................. G01M 11/33; G01R 31/021
USPC ........................................................ 324/539
See application file for complete search history.

(56) References Cited

U.S. PATENT DOCUMENTS

| | | | | |
|---|---|---|---|---|
| 6,157,200 | A * | 12/2000 | Okayasu .......... | G01R 31/31924 324/754.23 |
| 2006/0140114 | A1* | 6/2006 | Cochran ................... | H04L 1/24 370/229 |
| 2008/0231297 | A1* | 9/2008 | Kang ............... | G01R 31/31725 324/750.02 |
| 2009/0030649 | A1* | 1/2009 | Cagno ..................... | G01B 7/02 702/158 |
| 2010/0049453 | A1* | 2/2010 | Watanabe ........ | G01R 31/31922 702/58 |
| 2011/0320885 | A1* | 12/2011 | Owaki .................. | G06F 11/277 714/48 |

(Continued)

OTHER PUBLICATIONS

Wikpedia, "Active Cable, Wikipedia, the free encyclopedia," Oct. 24, 2014, 5 pages.

(Continued)

*Primary Examiner* — Son Le
*Assistant Examiner* — Akm Zakaria
(74) *Attorney, Agent, or Firm* — Schwabe, Williamson & Wyatt, P.C.

(57) ABSTRACT

Embodiments of the present disclosure provide configurations for testing arrangements for testing multi-lane active cables. In one embodiment, a testing arrangement may comprise a testing module comprising a pattern generator to be coupled with an active cable having a plurality of lanes to generate a test pattern to be transmitted over the active cable, wherein the test pattern is to be transmitted at least over two or more lanes of the active cable that are concatenated, and a processing unit to be coupled with the active cable to process a result of the transmission of the test pattern over the active cable. The arrangement may further include a plurality of testing cables to concatenate two or more of the lanes of the active cable, to enable the transmission of the test pattern over the concatenated lanes of the active cable. Other embodiments may be described and/or claimed.

21 Claims, 5 Drawing Sheets

(56) References Cited

U.S. PATENT DOCUMENTS

2012/0191402 A1* 7/2012 Filler .................... G06F 11/263
　　　　　　　　　　　　　　　　　　　　　702/119

OTHER PUBLICATIONS

Wikipedia, "Twinaxial Cabling," Wikipedia, the free encyclopedia, May 13, 2014, 6 pages.
FCI, "Mini-SAS HD Active Optical Cable (AOC) Assembly," Overview, Features and Benefits, FCI Electronics, Mar. 28, 2013, 2 pages.
Quellan, "Considerations for Active Copper Cables for SAS," T10/08-033r0, Gourgen Oganessyan Quellan, Dec. 20, 2007, 14 pages.

* cited by examiner

ACTIVE CABLE TESTING

FIELD

Embodiments of the present disclosure generally relate to testing technologies for interconnect devices, and more particularly, to testing multi-lane active cables.

BACKGROUND

Active electrical and optical cables are common solutions for high-speed data transfer between systems, such as connection between a computer and a peripheral device, two computers in a cluster, a switch to an endpoint, etc. An active electrical cable may contain electrical wiring and active electronic devices (electrical repeaters or retimers) at both ends, where each device communicates with one neighboring terminal system. An active optical cable may include a pair or multiple pairs of optical fibers with non-detachable optical modules on both sides. An optical module may convert the electrical signals at the cable's interface to optical signals on the fibers and vice versa.

Using active cables may create a challenge of testing the cable quality. Instead of loss data used to test regular passive cables, the important characteristic of an active cable is the bit error rate (BER) of the communication between the repeaters. This characteristic may need to be verified for a given active cable. However, compared to regular cable testing, the measurements involved may take much longer and may require expensive and complex equipment.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
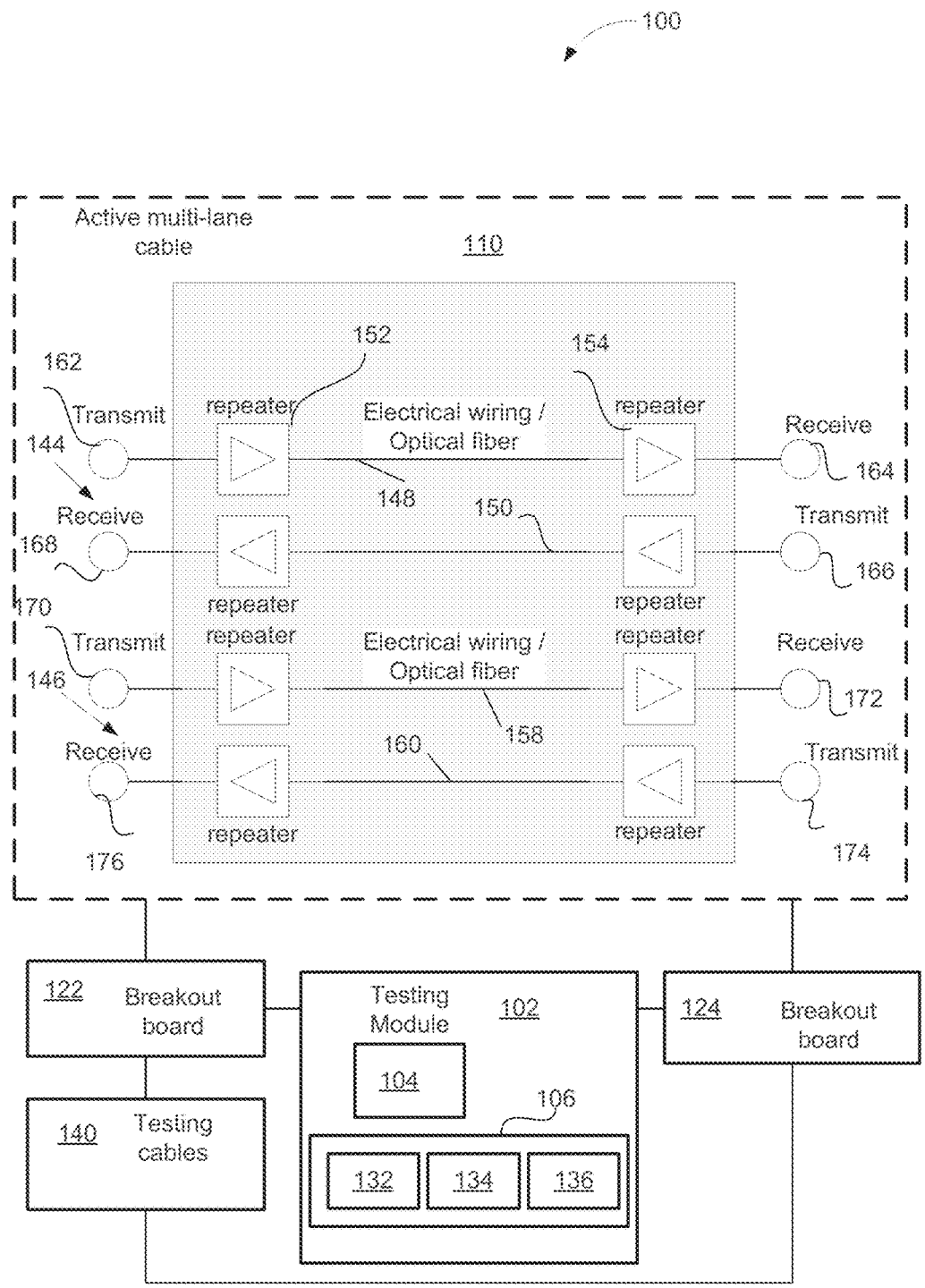
FIG. 1 is a diagram illustrating an example cable testing arrangement for testing active multi-lane cables, such as electric active cables or optical active cables, in accordance with some embodiments.

Embodiments of the present disclosure include configurations for cable testing arrangements for testing multi-lane active cables. In one embodiment, a testing arrangement may comprise a testing module comprising a pattern generator to be coupled with an active cable having a plurality of lanes to generate a test pattern to be transmitted over the active cable, including transmitting the test pattern at least over two or more lanes of the active cable that are concatenated. The testing arrangement may further include a processing unit to be coupled with the active cable to process a result of the transmission of the test pattern over the active cable. The testing arrangement may further include a plurality of testing cables to concatenate two or more of the lanes of the active cable, to enable the transmission of the test pattern over the concatenated lanes of the active cable.

In some embodiments, all lanes of the active cable may be concatenated and the test pattern may be transmitted once over all lanes, in order to test the active cable. In some embodiments, all lanes of the active cable may be concatenated, except one lane. The test pattern may be transmitted over the concatenated lanes and the non-concatenated lane, in order to test the non-concatenated lane. The test may be repeated to test each lane of the active cable.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

FIG. 1 is a diagram illustrating an example cable testing arrangement 100 for testing active multi-lane cables, such as electric active cables or optical active cables, in accordance with some embodiments. The cable testing arrangement 100 may include a testing module 102 that may comprise a pattern generator 104 to generate a test pattern to be transmitted over an active cable 110 coupled with the testing module 102. As will be shown, the cable testing arrangement 100 may be configured to test the active cable 110 with a test pattern (e.g., one test pattern) generated by the pattern generator 104. The pattern generator 104 may be configured to generate a test pattern comprising, for example, a pseudo-random binary sequence (PRBS), a quasi-random signal source (QRSS), bridgetap, multipat, or other random data sequences suitable for cable testing.

The testing module 102 may further comprise a processing unit 106 to process a result of the transmission of the test pattern over the active cable 110. The processing unit 106 may comprise a number of components. The components may include a processor 132, coupled with a memory 134 configured to enable the above-noted and other functionalities of the testing module 102. For example, the processor 132 may be configured with executable instructions stored in the memory 134 to enable operations of the testing module 102. In some embodiments, the processing unit 106 may further include additional components 136 that may be necessary for operation of the testing module 102, but are not the subject of the present disclosure. In some embodiments, the testing module 102 may comprise a bit error rate (BER) tester.

The cable testing arrangement 100 may further include a plurality of testing cables 140 and first and second breakout boards 122, 124 coupled with the active cable 110 to provide selective connections for the testing cables 140 with the active cable 110 as will be described below in greater detail.

The active cable 110 may be a multi-lane cable, e.g., may comprise multiple lines 144, 146, only two of which are shown in FIG. 1 for simplicity purposes. Each line 144, 146 may include a signal transmission path 148 and signal reception path 150. For purposes of description, the paths 148, 150 will be called "lanes" hereinafter. Accordingly, the illustrative multi-lane cable 110 may include a plurality of lanes 148, 150, 158, 160, as shown.

If the active cable 110 comprises an active electric cable, each lane 148, 150, 158, 160 may comprise electrical wiring and include one or more active electronic devices (e.g., semiconductor chips), such as repeaters (or retimers) 152, 154 (hereinafter "repeaters"), configured to boost cable performance and located at the lane ends as shown. Each repeater 152, 154 may communicate with a neighboring terminal system at each end of the lane. If the active cable 110 is an active optical cable, each lane 148, 150, 158, 160 may comprise optical fibers, and repeaters 152, 154 may comprise optical modules configured to convert the electrical signals to optical signals on the fibers and vice versa. Some optical modules may also perform retiming, e.g., may detect bits from the signal in each domain (electrical or optical), and transmit them to the other domain with corrected timing, so that noise and jitter in one domain do not affect the other domain. For optical fibers, the repeater on the transmit side of a lane may perform conversion from an electrical signal to an optical signal, and the repeater on the receive side of the lane may perform the conversion from an optical signal to an electrical signal.

In summary, repeaters 152, 154 may communicate with each other over the lane 148, relaying the data transmitted from the terminal systems that may be connected to the lane 148. Repeaters 152, 154 may provide equalization, clock recovery, or signal processing required for the communication across the lane 148. For example, repeaters 152, 154 may be configured to boost or recover a data signal transmitted over the lane 148 respectively. This signal relay functionality may increase the noise immunity, enable extending the length of the active cable 110, and allow the terminal system to be agnostic of a type of active cable and its length.

Each lane 148, 150, 158, 160 may include terminals 162, 164, 166, 168, 170, 172, 174, 176 located respectively at each end of the lane, to provide connections with the testing cables 140 via the breakout boards 122, 124 as described below.

Figure 2:
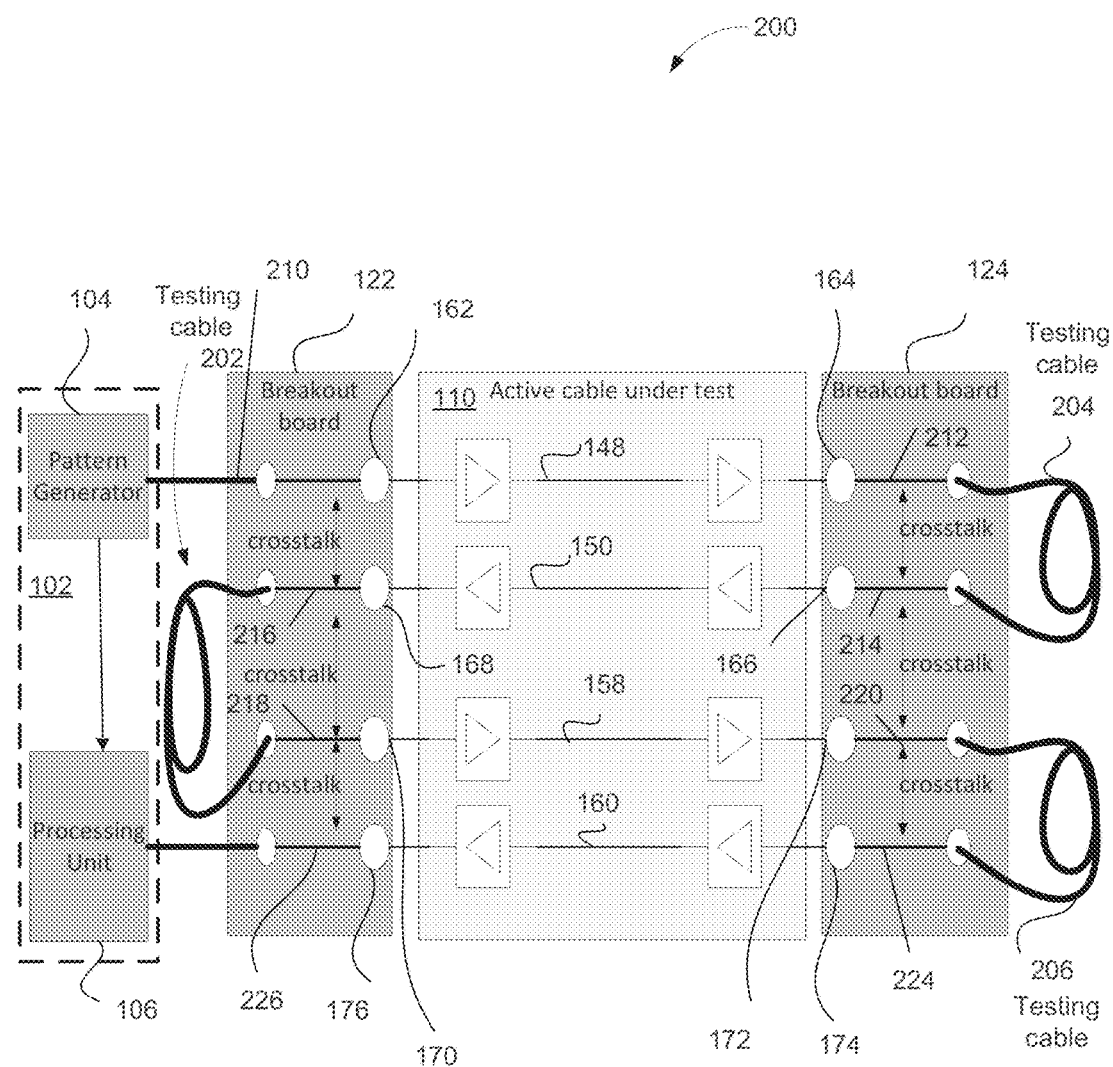
FIG. 2 is a block diagram illustrating an example configuration of the cable testing arrangement described in reference to FIG. 1, in accordance with some embodiments.

FIG. 2 is a block diagram illustrating an example configuration of the cable testing arrangement described in reference to FIG. 1, in accordance with some embodiments. As described above, the cable testing arrangement 200 may include testing module 102 having a pattern generator 104 and processing unit 106. The testing arrangement 200 may further include a plurality of testing cables 202, 204, 206. The testing cables 202, 204, 206 may comprise a coaxial cable, a twin-axial cable, or a twisted pair cable. As shown, the testing cables 202, 204, 206 may be arranged to provide loopback connections to concatenate at least some (e.g., two or more, or all) of the plurality of lanes 148, 150, 158, 160 of the active cable 110, to enable the transmission of the one test pattern generated by the pattern generator 104 over the concatenated lanes of the active cable 110, in accordance with some embodiments. In the illustrated example configuration, the testing cables 202, 204, 206 provide loopback connections to concatenate the lanes 148, 150, 158, 160.

The active cable 110 may be connected on both ends to breakout boards 122, 124, configured to enable connection of the cable 110 terminals (e.g., 162, 168, 170, etc.) to test equipment using the testing cables 202, 204, 206. As shown, the breakout board 122 may provide connections (links) 216, 218 for loopback connection of lanes 150 and 158 via terminals 168, 170, and the testing cable 202. The breakout board 122 may also provide connection (link) 210 to connect the pattern generator 104 with the lane 148 via the terminal 162. The breakout board 122 may also provide connection (link) 226 to connect the processing unit 106 with the lane 160 via the terminal 176.

Similarly, the breakout board 124 may provide connections (links) 212, 214, 220, and 224 for loopback connection of lanes 148 and 150, and 158 and 160, via respective terminals 164, 166, 172, and 174, and the testing cables 204 and 206.

Accordingly, the pattern generator 104 may be connected with concatenated lanes 148, 150, 158, 160 via connection (link) 210, to inject the test pattern into the concatenated lanes and thus enable the transmission of the test pattern over the concatenated lanes of the active cable 110. The processing unit 106 may be connected with concatenated lanes 148, 150, 158, 160 via connection (link) 226, to enable processing of a result of the injection of the test pattern into the concatenated lanes of the active cable 110 lanes after the test pattern traversed the concatenated lanes of the active cable 110.

Using the cable testing arrangement 200, the active cable 110 may be tested as follows. At one end of the cable 110, a test pattern with a period of desired length (for example, PRBS31 or another sequence with a comparable period) may be injected by the pattern generator 104 via the link 210 into the transmit side of one lane (e.g., lane 148). At the other end of the active cable 110, the recovered signal at the receive side of the same lane 148 is expected to be valid and represent the same test pattern (with a propagation delay caused by the lane 148), so it may be looped back to the transmit side, e.g., on lane 150, and so on, until the test pattern reaches the processing unit 106 via the link 226. At the processing unit 106, the final received test pattern may be checked for an error characteristic (e.g., BER) against the transmitted test pattern.

The described operation may test signal paths provided by lanes 148, 150, 158, 160 and induce crosstalk on and from these lanes. It may be desirable to reduce local correlation between the test pattern and the induced crosstalk. Accordingly, the loopback provided by the testing cables 202, 204, 206 may comprise a determined length, in order to cause the signals at two ends of each lane 148, 150, 158, 160 to be substantially uncorrelated, and create an effect representative of uncorrelated crosstalk, to emulate a regular operation of the active cable 110. For example, at a bit rate of 10 Gb/s, a one-meter long testing cable may create a delay of more than 50 bit times, which may cause the signals at two ends of a lane (e.g., 148, 150, 158, 160 to be locally uncorrelated, and create an effect representative of crosstalk. The length of each of the testing cables 202, 204, 206 may be, for example, equal to or greater than a length of each of the lanes 148, 150, 158, 160 of the active cable 110, to enable a substantially uncorrelated crosstalk between the lanes 148, 150, 158, 160 during the transmission of the test pattern over the concatenated lanes of the active cable 110.

It will be appreciated that the active cable 110 is shown as having four lanes 148, 150, 158, 160 for illustrative purposes only. In general, the active cable 110 may have N (e.g., N>1) lanes. Accordingly, a total number of loopbacks applied to the active cable 110 in order to concatenate all lanes comprising the cable may be N−1.

In addition to creating the crosstalk stress emulating a regular operation of the active cable 110, any error that may occur in any of the lanes 148, 150, 158, 160 may be present at the output, to be received by the processing unit 106. Accordingly, a single test (e.g., BER test) may measure the total BER over all lanes of the active cable 110. Typically, the BER requirement is stated per direction of one lane, so the total BER measured by the processing unit 106 may be larger by a factor of N. However, as a practical matter, one of the concatenated lanes may present a performance bottleneck and may have a BER value that may dominate the total measurement, while the other remaining lanes may have a lower BER. Thus, for practical purposes, the total BER may be considered as a maximum of BER of all lanes.

The active cable test operation described above saves equipment cost because instead of N test pattern generators required in a conventional active cable test, it may require only one test pattern generator (e.g., 104) to produce one test pattern as described above. Accordingly, the total cost of N−1 test pattern generators may be saved. The active cable test operation described above may also save test time (by a factor of N) because only one test may be needed to test all of the lanes of the active cable 110, in contrast to a conventional active cable test in which each lane may be tested separately. Furthermore, no re-connections of testing cables may be required for the test operation described above, in contrast to the conventional active cable test. The additional benefit of the active cable test operation described above is that the loopbacks are connected in a way that introduces locally uncorrelated crosstalk at the electrical interfaces (e.g., terminals 162, 164, etc.) of the active cable 110.

One of the effects of the cable test operation described in reference to FIG. 2 is that jitter (noise) resulting from transmission of a test pattern over concatenated lanes 148, 150, 158, 160 may typically increase by the receive operation of the repeaters associated with the lanes (e.g., repeaters 152, 154, etc., as indicated in FIG. 1). Due to multiple repeaters present in the active cable 110, jitter may propagate across the loopback connections and accumulate, causing a jitter accumulation effect. Because a regular active cable operation may not typically involve jitter accumulation, the test operation described above may create an excessive jitter stress, and as a result may not correctly reflect (emulate) a regular active cable operation. Further, the excessive jitter stress may cause some functional cables to fail.

If an active cable tested according to the test operation described above passes the test (e.g., the BER associated with the test remains within a desired range), the active cable may be deemed operational. However, if the active cable tested according to the test operation described above fails the test (e.g., the BER associated with the test is above a desired threshold), it may not necessarily mean that the active cable is not operational, because excessive stress provided by the jitter accumulation effect has been applied to the active cable during the test. Accordingly, a different cable test may be required in order to determine whether the active cable under test is operational. An example of such a test is described below in reference to FIG. 3.

Figure 3:
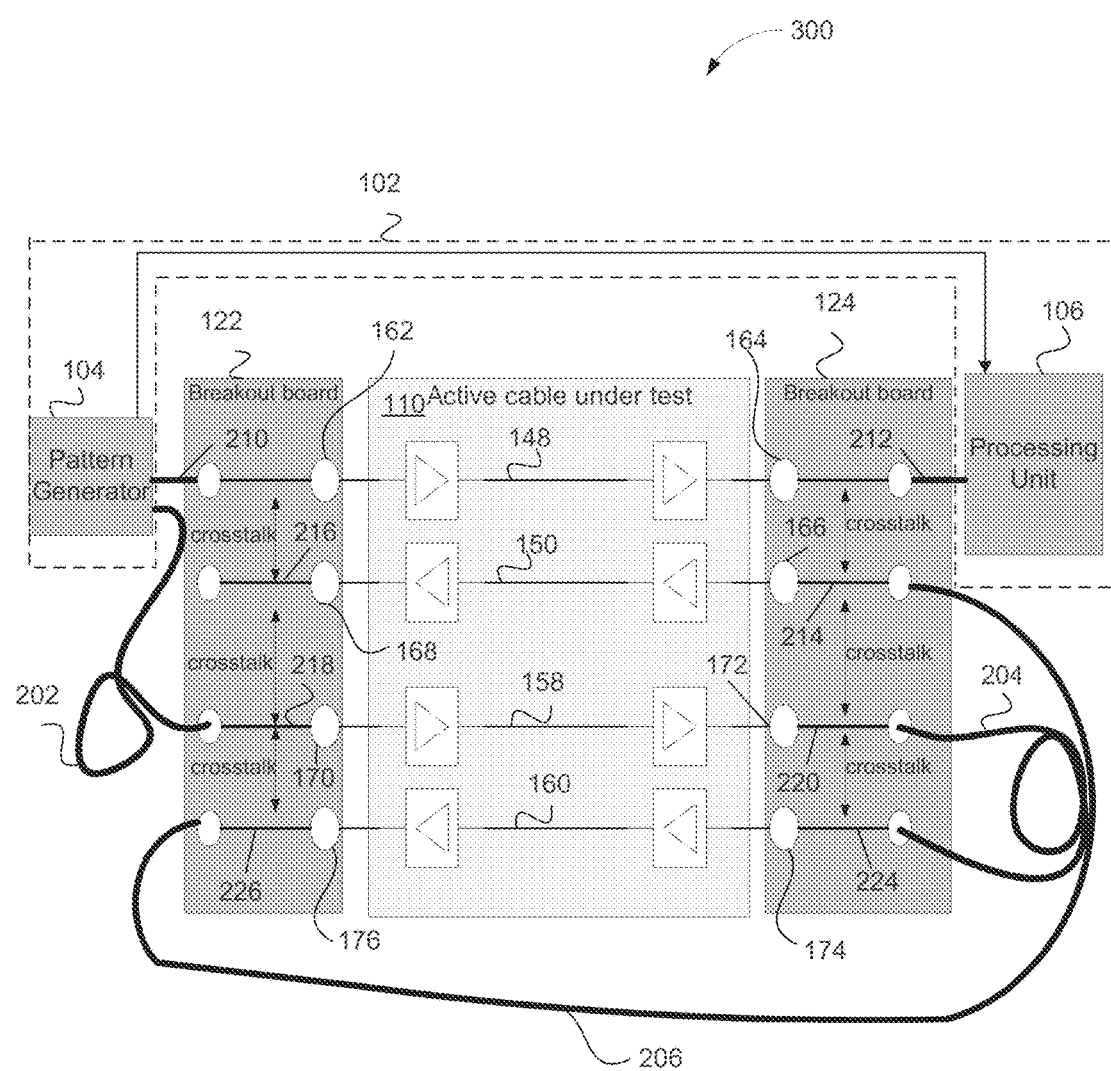
FIG. 3 is a block diagram illustrating another example configuration of the cable testing arrangement described in reference to FIG. 1, in accordance with some embodiments.

FIG. 3 is a block diagram illustrating an example configuration of the cable testing arrangement described in reference to FIG. 1, in accordance with some embodiments. Similar to the cable testing arrangement of FIG. 2, the cable testing arrangement 300 may include testing module 102 having a pattern generator 104 and processing unit 106. The testing arrangement 300 may further include a plurality of testing cables 202, 204, 206. As shown, the testing cables 202, 204, 206 may be arranged to provide loopback connections to concatenate all of the lanes of the active cable 110, except one lane, to enable the transmission of the test pattern generated by the pattern generator 104 over the concatenated lanes of the active cable 110, in accordance with some embodiments. In the illustrated example configuration, the testing cables 202, 204, 206 provide loopback connections for connecting lanes 150, 158, 160 to concatenate the lanes 150, 158, 160 excepting one lane, 148.

The pattern generator 104 may be configured to inject one test pattern into the concatenated lanes of the active cable 150, 158, 160 and inject the one test pattern into the lane that is not concatenated with other lanes, e.g., lane 148. As shown, the breakout board 122 may provide connection (link) 226 for loopback connection of lanes 160 and 150 via terminals 176, 166, and the testing cable 206. The breakout board 122 may also provide connection (link) 210 to connect the pattern generator 104 with the lane 148 via the terminal 162. The breakout board 122 may also provide connection (link) 218 to connect the pattern generator 104 with the lane 158 (and consequently, with concatenated lanes 150, 160) via the terminal 170 and testing cable 202. The breakout board 124 may provide connections (links) 214, 220, and 224 for loopback connection of lanes 150 and 160, and 158 and 160, via respective terminals 166, 172, and 174, and the testing cables 204 and 206. The breakout board 124 may connect the processing unit 106 with lane 148 via link 212 and terminal 164. As shown, the pattern generator 104 is connected with the processing unit 106 within the testing module 102, in order to relay the test pattern to the processing unit 106 for comparison with the result of the pattern injection into the lane 148 and further analysis (e.g., determination of error characteristic, such as BER).

Accordingly, the breakout board 122 may be configured to connect the pattern generator 104 with a first end of the non-concatenated lane 148 via link 210 to enable the test pattern injection into that lane, and connect the pattern generator 104 with the concatenated lanes 150, 158, 160 via one of the testing cables (e.g., 202) to enable the test pattern injection into the concatenated lanes. The breakout board 124 may be configured to connect the processing unit 106 with a second end of the non-concatenated lane 148 via link 212, to enable processing of a result of the injection of the test pattern into that lane. Once the non-concatenated lane 148 is tested, the testing cables 202, 204, 206 may be reconnected to test the next lane (e.g., 150) in a similar way, and so on, until all lanes comprising the active cable 110 are tested.

More generally, the test operation described above may be conducted as follows. At one end of the active cable 110 (e.g., terminal 162), a test pattern may be injected into the transmit side of lane 148 (the path under test). At the other end (terminal 164), the processing unit 106 may check the recovered signal at the receive side of the same lane for BER against the transmitted pattern. The remaining N−1 signal paths (lanes 150, 158, 160) may be concatenated using loopbacks in a manner similar to the test operation described in reference to FIG. 2. The input to this concatenated path may be connected to the test pattern generator 104 through an additional testing cable 202, which may create locally uncorrelated crosstalk from all interfering signal paths (lanes 150, 158, 160) that affect the path under test (lane 148). Once BER testing on one lane is completed, the connections may be modified to enable testing the next of the remaining lanes. The test operation described in reference to FIG. 3 may require the same equipment as the test operation described in reference to FIG. 2, and, accordingly, may result in the same test equipment cost saving compared to a conventional test. The test time of the test operation of FIG. 3 may be comparable with the test time of the conventional test. As described above, the active cable may comprise electric or optical fiber cable. The test operations described above may be agnostic to a type of the active cable under test.

A test bench may be constructed such that the active cable may be first tested using the test operation of FIG. 2, and if the test fails, the active cable may be tested using the test operation of FIG. 3.

Figure 4:
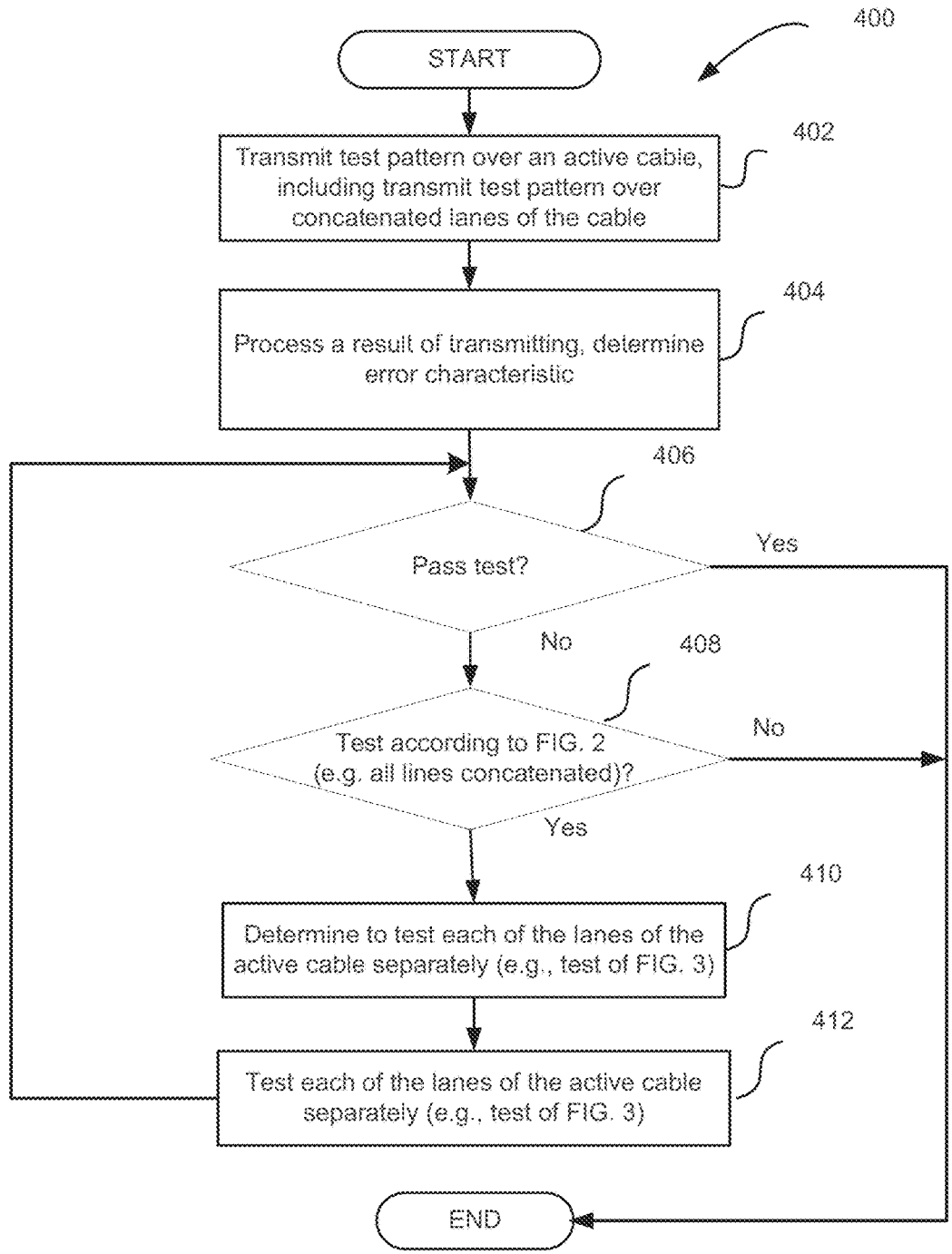
FIG. 4 is a process flow diagram illustrating an example process for testing an active multi-lane cable, in accordance with some embodiments.

FIG. 4 is a process flow diagram illustrating an example process for testing an active multi-lane cable, in accordance with some embodiments. The process 400 may comport with the test operations described in connection with FIGS. 1-3 in some embodiments.

At block 402, the process 400 may include transmitting a test pattern over an active cable, including transmitting the test pattern over concatenated lanes of the active cable, where the concatenated lanes comprise two or more of plurality of lanes of the active cable. Transmitting the test pattern may include a test pattern generator injecting the test pattern into the lanes concatenated with a plurality of testing cables, wherein each of the plurality of testing cables comprises a first length that is equal to or greater than a second length of each of the lanes of the active cable.

At block 404, the process 400 may include a processing unit processing a result of transmitting the one test pattern over the concatenated lanes to determine an error characteristic associated with transmitting the test pattern over the active cable.

In some embodiments, the actions described in reference to blocks 402, 404 may comport with the test operation described in reference to FIG. 2. For example, the concatenated lanes may comprise all of the plurality of lanes of the active cable and the processing unit may process a result of the injection of the test pattern into the concatenated lanes after the test pattern traversed the concatenated lanes of the active cable.

At decision block 406, the process 400 may include a determination of whether the test was successful, e.g., whether the determined error characteristic (e.g., BER) meets the determined conditions (e.g., value range or threshold). If the cable passes the test, the process 400 may end.

If the cable does not pass the test, at decision block 408, the process 400 may further include a determination of whether the conducted test comported with the test of FIG. 2, e.g., whether it includes injecting the test pattern into all of the lanes of the active cable, wherein all of the lanes are concatenated with the plurality of testing cables as described above. If the test is not the test of FIG. 2, the process 400 may end with the determination that the cable failed the test.

If the test is determined to be the test of FIG. 2, at block 410, based on a result of the determined error characteristic, it may be determined to test each of the lanes of the active cable separately, e.g., using the test of FIG. 3.

At block 412, the process 400 may include conducting the test of FIG. 3. For example, the one test pattern may be injected into all of the lanes of the active cable except one lane, wherein all of the lanes except the one lane are concatenated, and the one test pattern may be injected into the one lane that is not concatenated with other lanes. The process 400 may then move back to block 406 to determine whether the cable passed the conducted test. For example, the processing unit may process a result of the injection of the test pattern into the non-concatenated lane and determine whether the error characteristic (e.g., BER) associated with the test pattern transmission over the non-concatenated lane satisfies desired conditions (e.g., within a desired range).

Figure 5:
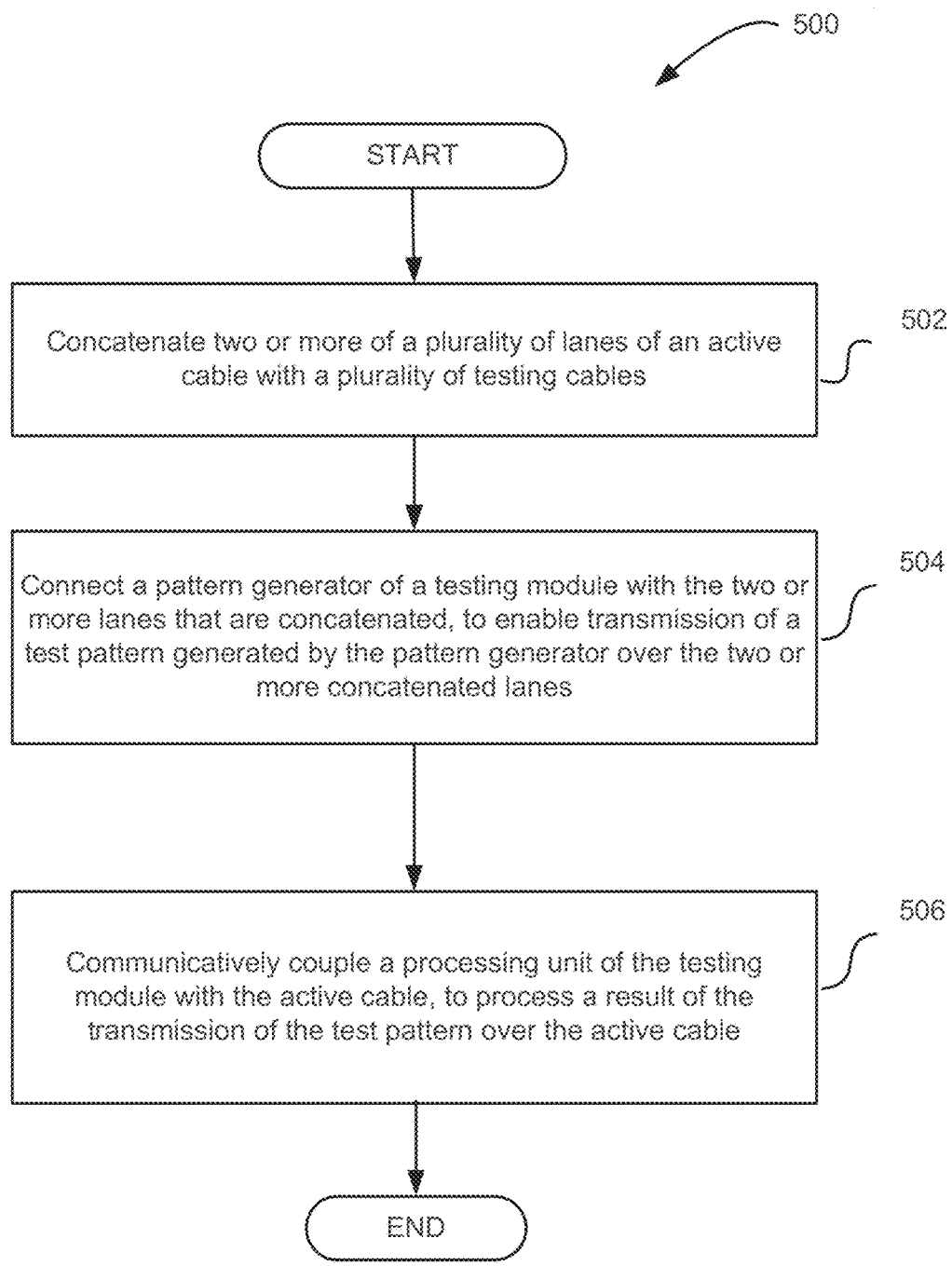
FIG. 5 is a process flow diagram illustrating an example process for providing a testing arrangement for testing an active multi-lane cable, in accordance with some embodiments.

FIG. 5 is a process flow diagram illustrating an example process for providing a testing arrangement for testing an active multi-lane cable, in accordance with some embodiments. The process 500 may comport with the configurations described in connection with FIGS. 1-3 in some embodiments.

At block 502, the process 500 may include concatenating two or more of a plurality of lanes of an active cable with a plurality of testing cables. Each of the plurality of testing cables may comprise a first length that is equal to or greater than a second length of each of the plurality of lanes of the active cable.

At block 504, the process 500 may include connecting a pattern generator of a testing module with the two or more lanes that are concatenated, to enable transmission of a test pattern generated by the pattern generator over the two or more concatenated lanes.

At block 506, the process 500 may include communicatively coupling a processing unit of the testing module with the active cable, to process a result of the transmission of the test pattern over the active cable.

In some embodiments, two or more of a plurality of lanes may include all of the plurality of lanes. Accordingly, communicatively coupling a processing unit with the active cable may include connecting the processing unit to the concatenated lanes.

In some embodiments, two or more of a plurality of lanes of the active cable may include all of the plurality of lanes except one lane. Accordingly, connecting a pattern generator may include connecting the pattern generator to the concatenated lanes and to the one lane. Communicatively coupling a processing unit may include connecting the processing unit to the one lane that is not concatenated. More specifically, the pattern generator may be connected with a first end of the lane, and the processing unit may be connected with a second end of the lane.

Connecting the pattern generator with a first end of the lane may include connecting the pattern generator with the first end via a first breakout board coupled with a first end of the active cable. Connecting the processing unit with a second end of the one lane may include connecting the processing unit with the second end via a second breakout board coupled with a second end the active cable. The first end of the lane may correspond to the first end of the active cable and the second end of the one lane may correspond to the second end of the active cable.

As a result of the actions described above, the testing arrangement may be assembled and configured to enable performance of multi-lane active cable test operations described in reference to FIG. 2 or FIG. 3.

The embodiments described herein may be further illustrated by the following examples. Example 1 is a cable testing arrangement, comprising: a testing module comprising a pattern generator to be coupled with an active cable having a plurality of lanes to generate a test pattern to be transmitted over the active cable, wherein the test pattern is to be transmitted at least over two or more lanes of the active cable that are concatenated, and a processing unit to be coupled with the active cable to process a result of the transmission of the test pattern over the active cable; and a plurality of testing cables to concatenate the two or more of the plurality of lanes of the active cable, to enable the transmission of the test pattern over the two or more concatenated lanes of the active cable.

Example 2 may include the subject matter of Example 1, and further specifies that the plurality of testing cables is to concatenate all of the lanes of the active cable, wherein the pattern generator is to inject the test pattern into the concatenated lanes of the active cable, wherein the processing unit is to process a result of the injection of the test pattern into the concatenated lanes after the test pattern traversed the concatenated lanes of the active cable.

Example 3 may include the subject matter of Examples 1 to 2, and further specifies that the plurality of testing cables is to concatenate all of the lanes of the active cable, except one lane, wherein the pattern generator is to inject the test pattern into the concatenated lanes of the active cable and the one lane that is not concatenated with other lanes.

Example 4 may include the subject matter of Example 3, and further specifies that the pattern generator is to: connect with a first end of the one lane to enable the test pattern injection into the one lane; and connect with the concatenated lanes via one of the testing cables to enable the test pattern injection into the concatenated lanes.

Example 5 may include the subject matter of Example 4, and further specifies that the processing unit is to connect with a second end of the one lane, to process a result of the injection of the test pattern into the one lane.

Example 6 is a method for assembling an active cable testing arrangement, comprising: concatenating two or more of a plurality of lanes of an active cable with a plurality of testing cables; connecting a pattern generator of a testing module with the two or more lanes that are concatenated, to enable transmission of a test pattern generated by the pattern generator over the two or more concatenated lanes; and communicatively coupling a processing unit of the testing module with the active cable, to process a result of the transmission of the test pattern over the active cable.

Example 7 may include the subject matter of Example 6, and further specifies that two or more of a plurality of lanes include all of the plurality of lanes, wherein communicatively coupling a processing unit with the active cable includes connecting the processing unit to the concatenated lanes.

Example 8 may include the subject matter of Example 6, and further specifies that two or more of a plurality of lanes of the active cable include all of the plurality of lanes except one lane, wherein connecting a pattern generator includes connecting the pattern generator to the concatenated lanes and to the one lane; and communicatively coupling a processing unit includes connecting the processing unit to the one lane.

Example 9 may include the subject matter of Example 8, wherein the method further comprises: connecting the pattern generator with a first end of the one lane; and connecting the processing unit with a second end of the one lane.

Example 10 may include the subject matter of Example 9, and further specifies that connecting the pattern generator with a first end of the one lane includes connecting the pattern generator with the first end via a first breakout board coupled with a first end of the active cable.

Example 11 may include the subject matter of Example 10, and further specifies that connecting the processing unit with a second end of the one lane includes connecting the processing unit with the second end via a second breakout board coupled with a second end the active cable, wherein the first and second provide selective connections for the plurality of testing cables with the two or more of the plurality of lanes of the active cable, wherein the first end of the one lane corresponds to the first end of the active cable and wherein the second end of the one lane corresponds to the second end of the active cable.

Example 12 may include the subject matter of Example 6, and further specifies that concatenating two or more of a plurality of lanes of an active cable with a plurality of testing cables includes concatenating the two or more lanes with selected ones of: a coaxial cable, a twin-axial cable, or a twisted pair cable.

Example 13 may include the subject matter of Example 6, and further specifies that concatenating two or more of a plurality of lanes of an active cable with a plurality of testing cables includes concatenating the two or more lanes with the testing cables that have a first length that is equal to or greater than a second length of each of the lanes of the active cable.

Example 14 may include the subject matter of any of Examples 6 to 13, and further specifies that the active cable comprises one of an active optical cable or an active electric cable.

Example 15 is a method for testing an active cable, comprising: transmitting a test pattern over an active cable having a plurality of lanes, including transmitting the test pattern over two or more lanes that are concatenated; and processing a result of transmitting the test pattern over the active cable to determine an error characteristic associated with the transmission of the test pattern over the active cable.

Example 16 may include the subject matter of Example 5, and further specifies that transmitting a test pattern includes injecting the test pattern into the two or more lanes concatenated with a plurality of testing cables, wherein each of the plurality of testing cables comprises a first length that is equal to or greater than a second length of each of the lanes of the active cable.

Example 17 may include the subject matter of Example 16, and further specifies that the two or more lanes comprise all of the plurality of lanes of the active cable.

Example 18 may include the subject matter of Example 17, and further specifies that processing a result of transmitting the test pattern over the active cable includes: determining the error characteristic; and based on a result of the determined error characteristic, determining whether to test each of the plurality of lanes of the active cable separately.

Example 19 may include the subject matter of Example 18, and further specifies that determining the error characteristic includes determining a bit error rate (BER) associated with the transmitting of the test pattern over all of the plurality of lanes of the active cable.

Example 20 may include the subject matter of Example 16, and further specifies that the two or more lanes comprise all of the plurality of lanes of the active cable except one lane, wherein transmitting a test pattern over an active cable further comprises injecting the test pattern into the one lane that is not concatenated with other lanes.

Example 21 may include the subject matter of Example 20, and further specifies that processing a result of transmitting the test pattern includes: determining a result of injecting the test pattern into the one lane that is not concatenated with other lanes; and determining the error characteristic based on the determined result.

Example 22 may include the subject matter of any of Examples 15-21, and further specifies that transmitting a test pattern over an active cable includes transmitting over the active cable one of: a pseudo-random binary sequence (PRBS), a quasi-random signal source (QRSS), bridgetap, or multipat.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A cable testing arrangement, comprising:
a testing module comprising a pattern generator to be coupled with an active cable having a plurality of lanes to generate a test pattern to be transmitted over the active cable, wherein the test pattern is to be transmitted at least over two or more lanes of the active cable that are concatenated in loopback connections, and a processing unit to be coupled with the active cable to process a result of the transmission of the test pattern over the active cable, wherein to process includes to determine a bit error rate (BER) associated with the transmission of the test pattern over the active cable; and
a plurality of testing cables to concatenate the two or more of the plurality of lanes of the active cable in the loopback connections, to enable the transmission of the test pattern over the two or more lanes of the active cable concatenated in the loopback connections.

2. The cable testing arrangement of claim 1, wherein the plurality of testing cables is to concatenate all of the lanes of the active cable, wherein the pattern generator is to inject the test pattern into the concatenated lanes of the active cable, wherein the processing unit is to process a result of the injection of the test pattern into the concatenated lanes after the test pattern traversed the concatenated lanes of the active cable.

3. The cable testing arrangement of claim 1, wherein the plurality of testing cables is to concatenate all of the lanes of the active cable, except one lane, wherein the pattern generator is to inject the test pattern into the concatenated lanes of the active cable and the one lane that is not concatenated with other lanes.

4. The cable testing arrangement of claim 3, wherein the pattern generator is to:
connect with a first end of the one lane to enable the test pattern injection into the one lane; and
connect with the concatenated lanes via one of the testing cables to enable the test pattern injection into the concatenated lanes.

5. The cable testing arrangement of claim 4, wherein the processing unit is to connect with a second end of the one lane, to process a result of the injection of the test pattern into the one lane.

6. A method, comprising:
concatenating in loopback connections two or more of a plurality of lanes of an active cable with a plurality of testing cables;
connecting a pattern generator of a testing module with the two or more lanes that are concatenated in the loopback connections, to enable transmission of a test pattern generated by the pattern generator over the two or more lanes concatenated in the loopback connections; and
communicatively coupling a processing unit of the testing module with the active cable, to process a result of the transmission of the test pattern over the active cable, wherein to process includes to determine a bit error rate (BER) associated with the transmission of the test pattern over the active cable.

7. The method of claim 6, wherein two or more of a plurality of lanes include all of the plurality of lanes, wherein communicatively coupling a processing unit with the active cable includes connecting the processing unit to the concatenated lanes.

8. The method of claim 6, wherein two or more of a plurality of lanes of the active cable include all of the plurality of lanes except one lane,
wherein connecting a pattern generator includes connecting the pattern generator to the concatenated lanes and to the one lane; and
communicatively coupling a processing unit includes connecting the processing unit to the one lane.

9. The method of claim 8, further comprising:
connecting the pattern generator with a first end of the one lane; and
connecting the processing unit with a second end of the one lane.

10. The method of claim 9, wherein connecting the pattern generator with a first end of the one lane includes connecting the pattern generator with the first end via a first breakout board coupled with a first end of the active cable.

11. The method of claim 10, wherein connecting the processing unit with a second end of the one lane includes connecting the processing unit with the second end via a second breakout board coupled with a second end the active cable, wherein the first end and second end provide selective connections for the plurality of testing cables with the two or more of the plurality of lanes of the active cable, wherein the first end of the one lane corresponds to the first end of the active cable and wherein the second end of the one lane corresponds to the second end of the active cable.

12. The method of claim 6, wherein concatenating two or more of a plurality of lanes of an active cable with a plurality of testing cables includes concatenating the two or more lanes with selected ones of: a coaxial cable, a twin-axial cable, or a twisted pair cable.

13. The method of claim 6, wherein concatenating two or more of a plurality of lanes of an active cable with a plurality of testing cables includes concatenating the two or more lanes with the testing cables that have a first length that is equal to or greater than a second length of each of the lanes of the active cable.

14. The method of claim 6, wherein the active cable comprises one of an active optical cable or an active electric cable.

15. A method, comprising:
    transmitting a test pattern over an active cable having a plurality of lanes, including transmitting the test pattern over two or more lanes that are concatenated in loopback connections; and
    processing a result of transmitting the test pattern over the active cable, including determining an error characteristic associated with transmitting the test pattern over the active cable, wherein determining the error characteristic includes determining a bit error rate (BER) associated with transmitting the test pattern over all of the plurality of lanes of the active cable.

16. The method of claim 15, wherein transmitting a test pattern includes injecting the test pattern into the two or more lanes concatenated with a plurality of testing cables, wherein each of the plurality of testing cables comprises a first length that is equal to or greater than a second length of each of the lanes of the active cable.

17. The method of claim 16, wherein the two or more lanes comprise all of the plurality of lanes of the active cable.

18. The method of claim 17, wherein processing a result of transmitting the test pattern over the active cable includes:
    based on a result of the determined error characteristic, determining whether to test each of the plurality of lanes of the active cable separately.

19. The method of claim 16, wherein the two or more lanes comprise all of the plurality of lanes of the active cable except one lane, wherein transmitting a test pattern over an active cable further comprises injecting the test pattern into the one lane that is not concatenated with other lanes.

20. The method of claim 19, wherein processing a result of transmitting the test pattern includes:
    determining a result of injecting the test pattern into the one lane that is not concatenated with other lanes; and
    determining the error characteristic based on the determined result.

21. The method of claim 15, wherein transmitting a test pattern over an active cable includes transmitting over the active cable one of: a pseudo-random binary sequence (PRBS), a quasi-random signal source (QRSS), bridgetap, or multipat.

* * * * *